United States Patent [19]

Toyama

[11] Patent Number: 4,929,947
[45] Date of Patent: May 29, 1990

[54] CONSTANT WIDTH PULSE DISTRIBUTION IN A DIGITAL TO ANALOG CONVERTER FOR SERIAL DIGITAL DATA

[75] Inventor: Akira Toyama, Tokyo, Japan
[73] Assignee: Nippon Precision Circuits Ltd., Japan
[21] Appl. No.: 176,921
[22] Filed: Apr. 4, 1988

[30] Foreign Application Priority Data

Apr. 2, 1987 [JP] Japan ................. 62-81644

[51] Int. Cl.$^5$ ............................................. H03M 1/66
[52] U.S. Cl. ................... 341/146; 341/144; 341/152; 377/42
[58] Field of Search ........... 341/126, 141, 144, 146, 341/152, 153, 118, 60, 61, 53, 100, 101, 143; 307/261, 268; 377/41, 42, 75, 76, 72; 328/164

[56] References Cited

U.S. PATENT DOCUMENTS

| | | | |
|---|---|---|---|
| 3,603,977 | 9/1971 | Szabo et al. | 341/152 |
| 3,754,233 | 8/1973 | Sutherland | 341/152 |
| 4,087,813 | 5/1978 | Minner et al. | 341/145 |
| 4,663,610 | 5/1987 | Metz et al. | 341/144 |

Primary Examiner—William M. Shoop, Jr.
Assistant Examiner—Howard L. Williams
Attorney, Agent, or Firm—Bruce L. Adams; Van C. Wilks

[57] ABSTRACT

A digital-to-analog converter comprising: a distributing circuit (2, 3, 4, 5; 2, 13, 14–26) for distributing data pulses, which are bit-serially supplied at constant time intervals, into a plurality of routes and for providing them as pulses having a constant width; and a converting circuit (12) for adding together the pulses from the distributing circuit and thereby for converting them to an analog output. Such a circuit arrangement can provide pulses for conversion to analog form which all have an identical waveform and an identical area, and errors caused by the difference between the rise and fall times of the pulses can be eliminated and therefore D/A conversion characteristics can be improved.

4 Claims, 5 Drawing Sheets

CONSTANT WIDTH PULSE DISTRIBUTION IN A DIGITAL TO ANALOG CONVERTER FOR SERIAL DIGITAL DATA

BACKGROUND OF THE INVENTION

1. Field of the Invention

The present invention relates to a digital-to-analog converting device.

2. Description of the Prior Art

For example, a digital audio apparatus is known in which a sampled acoustic signal is converted to a one-bit serial data pulse train by means of the PDM (Pulse Density Modulation) technique, i.e. using e.g. a noise shaper, and the data pulses are reproduced as an acoustic signal by adding them together in an analog manner.

In the above circuit arrangement, sampling data of about 44 KHz is converted to a data pulse train of a very high frequency, i.e. about 11 MHz, so that the rising and falling portions of one such data pulse can amount to a significant proportion of the overall pulse. For this reason, when the rise and fall times differ from each other as shown at A in FIG. 5, a multiple pulse consisting of a plurality of coupled pulses will contain a data pulse P1 at the rising portion whose area is further significantly different from that of the other data pulses P2.

Further, if the data pulses have a long fall time, a data pulse P3 can accidentally overlap with another data pulse P4, as shown in FIG. 5B. Thus, such data pulses, when converted into an analog output, will produce an error which causes the digital-to-analog conversion characteristics to become nonlinear, deteriorating the tone quality.

An object of the present invention is therefore to improve the digital-to-analog conversion characteristics by means of an arrangement in which data pulses are all converted into pulses having an identical waveform and an identical area.

SUMMARY OF THE INVENTION

According to the present invention, bit-serially supplied data pulses are converted into pulses of a predetermined width to be transferred through a plurality of routes, and each of the latter pulses is converted into an analog signal by adding them together in an analog manner.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
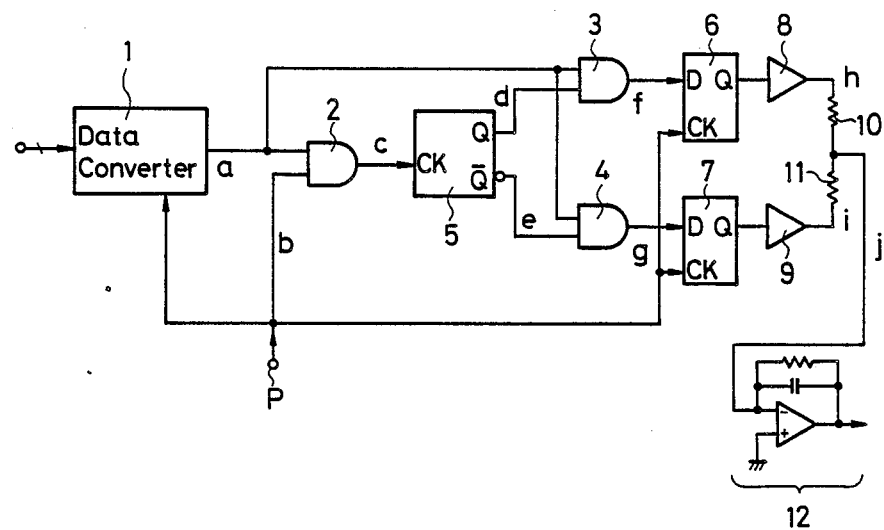
FIG. 1 is a logic circuit diagram showing an embodiment of the present invention.

In FIG. 1, 1 denotes a data converter comprising a noise shaper, a one-bit quantizing circuit, etc., which is adapted to convert a 16-bit sampling data of 44 KHz into a one-bit data pulse of 11 MHz. 2 through 4 denotes gate circuits and 5 through 7 denote flip-flop circuits, these circuits in combination constituting a distributing circuit. 8 and 9 denote amplifiers, 10 and 11 denote resistors having an identical resistance, and 12 denotes a low-pass filter, these circuits in combination constituting a converting circuit.

Figure 2:
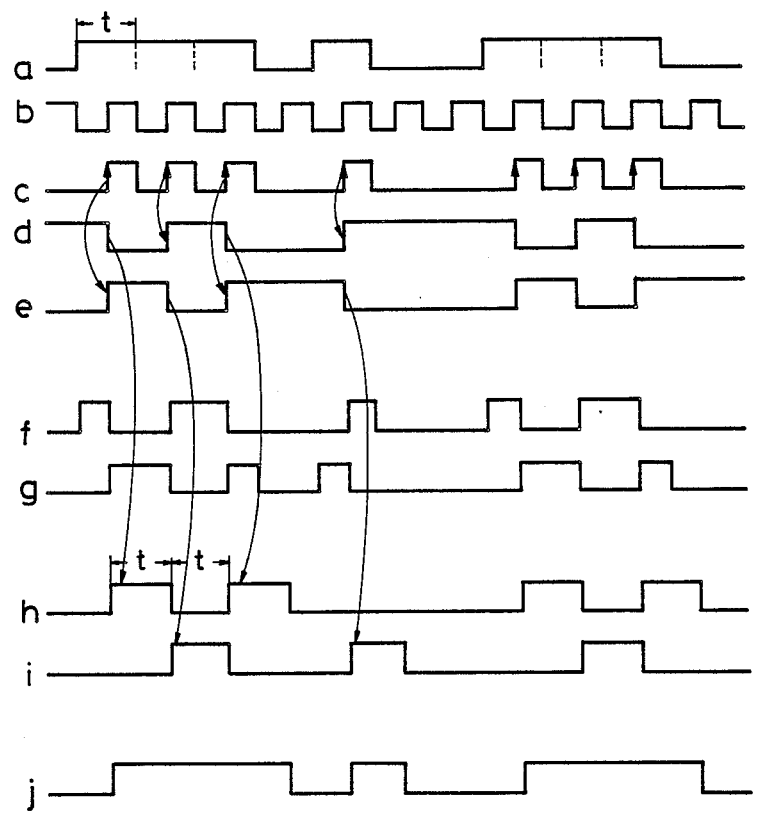
FIG. 2 is a time chart for illustrating the operation of the circuit shown in FIG. 1.

Next, a description will be given with respect to the operation. The data converter 1 is connected to receive clock pulses (shown in FIG. 2b) from a terminal P and convert an input data to a one-bit serial data pulse train; from its output, data pulses having a duration t are generated in continuously or discontinuously as shown in FIG. 2a. Such data pulses and said clock pulses will produce at the output of the gate circuit 2 one pulse for each data pulse, as shown in FIG. 2c. This pulse will trigger the flip-flop 5 which in turn generates output signal at its outputs alternately, as shown in FIG. 2d,e. Such output signals and the data pulses will cause the gate circuits 3, 4 to produce pulses alternately, as shown in FIG. 2f,g. These pulses are supplied to the D-inputs of the flip-flop circuits 6, 7 and are latched by the clock pulses. The flip-flop circuits 6, 7 will thus alternately generate pulses of a constant duration t, as shown in FIG. 2h, i. These pulses in two separate routes are combined by means of resistors 10, 11, as shown in FIG. 2j, and are added together in an analog manner so as to be converted to an analog signal.

Thus, the flip-flops 6, 7 will generate outputs alternately each time a data pulse in FIG. 2a is generated, and they are converted to pulses in two separate routes. These pulses in the two routes have a pulse width and the minimum pulse interval which are both equal to the time t, so that successive pulses will not overlap with each other, whereby all of the pulses will have an identical waveform and an identical area. Therefore, according to the invention, unlike the prior art circuit arrangement, coupling of successive pulses will not cause any change in pulse area, so that D/A conversion characteristics can be enhanced.

Alternatively, the AND-output of the pulses in FIG. 2c, d and the AND-output of the pulses in FIG. 2c, e may be output as the two-route pulses which are to be converted into an analog signal. In such a case, however, the pulse width is one half of that as obtainable by the above-mentioned embodiment and the rising and falling portions will be accompanied by a relatively large proportion of distortion. In this regard, the previous embodiment is preferred.

Figure 3:
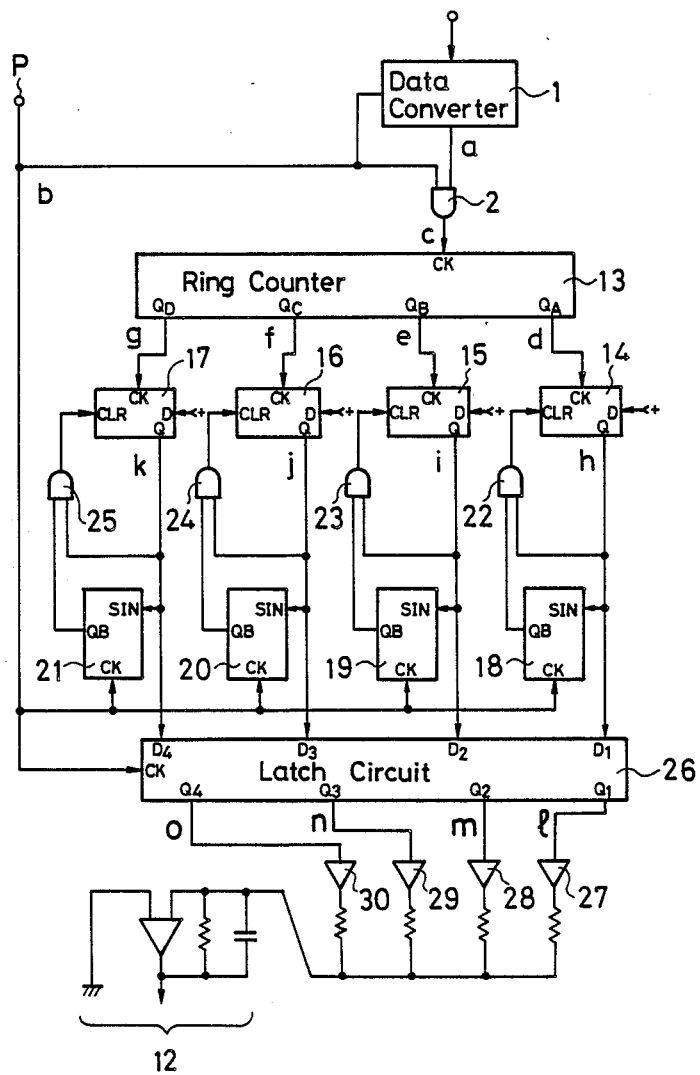
FIG. 3 is another logic circuit diagram showing another embodiment of the present invention.

Next, another embodiment will be described in which data pulses are converted to pulses for transfer through four separate routes. In FIG. 3, 13 denotes a 4-bit ring counter, 14 through 17 denote flip-flop circuits, 18 through 21 denotes shift registers for determining the pulse width, and 22 through 25 denote gate circuits, these elements in combination constituting a converting circuit. 26 denotes a latch circuit and 27 through 30 denote amplifiers. In FIGS. 1 and 3, identical numerals indicate identical elements.

Figure 4:
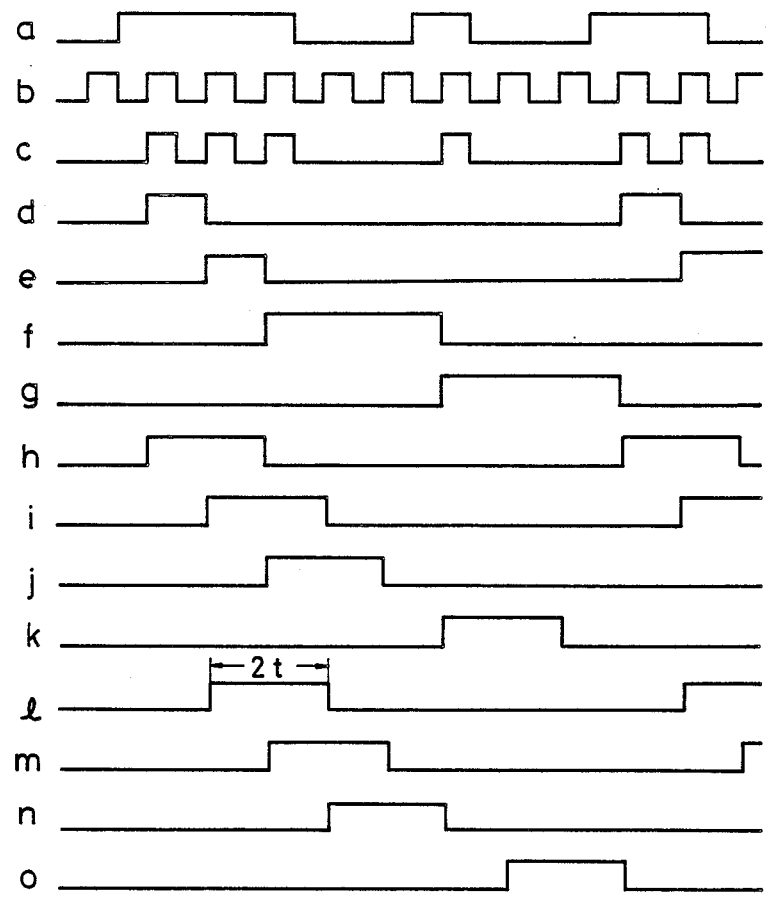
FIG. 4 is a time chart for illustrating the operation of the circuit shown in FIG. 3.
Figure 5:
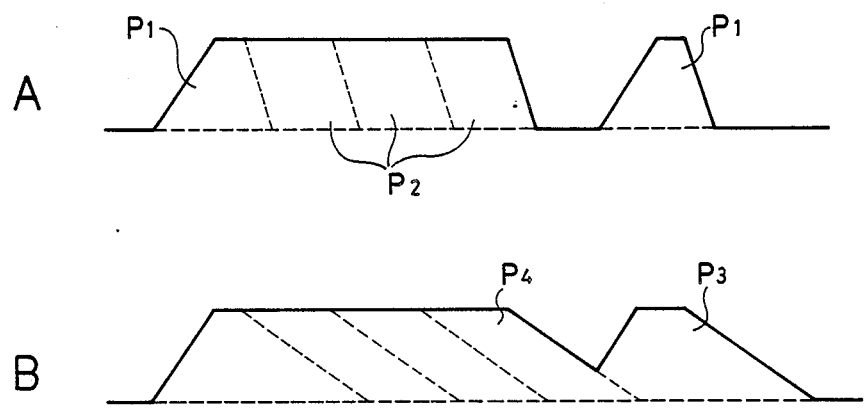
FIG. 5 is a diagram showing data pulse waveforms.

In the above-described arrangement, the gate circuit 2 will produce the pulses shown in FIG. 4c under the control of clock pulses in FIG. 4b when the data in FIG. 4a is supplied to the data converter 1. Upon receiving such pulses, the ring counter 13 sequentially generates selection outputs shown in FIG. d–g. Flip-flop circuit 14 is first triggered by the selection output in FIG. 4d, and its output becomes "1" as shown in FIG. 4h, and this output is stored in the shift register 18 under the control of the clock pulses. Upon receiving a total of two successive clock pulses, the shift register generates a "1" output, and the flip-flop circuit 14 is reset by the output from the gate circuit 22. Flip-flop circuit 14 will therefore generate an output pulse whose width is equal to two cycles (a time period of 2$t$) of the clock pulse, as shown in FIG. 4$h$.

The other flip-flop circuits 15–17 will generate pulses having the same pulse width as the above-described one in a strictly similar manner, as shown in FIGS. 4$i$–$k$.

The selection outputs in the four routes from the ring counter 13 are thus respectively converted to a pulse of constant width. With a delay corresponding to one clock pulse, they are latched by the latch circuit 26 which in turn generates output pulses of constant width, as shown in FIG. 4 $l$–$o$. Each pulse is supplied to a low-pass filter 12 via amplifiers 27–30 and via resistors having an identical resistance value, whereby they are added together and thus converted to an analog signal.

In the above embodiment, the ultimately obtainable pulse width and the minimum interval between such pulses are twice as large as those of the data pulse, so that the effect of the difference between the pulse rise and fall times is further reduced and thus the D/A conversion errors can be made extremely small.

In the embodiment shown in FIG. 3, the pulses in the respective routes from the flip-flops 14–17 are latched once by the latching circuit 26 and are then output. This is to eliminate subtle errors in the timing of the occurrence of the pulses caused by the dispersion of delay time of the shift registers, gate circuits, flip-flop circuits, etc. in various routes. Where such errors are negligible, the latching circuit 26 is not necessary.

Further, in the above embodiment, data pulses are distributed by a ring counter into four separate routes in a predetermined sequence. Alternatively, the ring counter 13 can be replaced by a 4-bit random pulse generating circuit which generates one pulse at a randomly selected one of its four outputs each time it receives a pulse from the gate circuit 2. According to such a circuit arrangement, it is possible to whiten the noises caused by the dispersion of the devices used in respective routes for the conversion into an analog signal and therefore it is possible to avoid deterioration of the tone quality.

According to the present invention, bit-serially supplied data pulses are converted to pulses of constant width in a plurality of routes and the latter pulses are added together in an analog manner and thereby converted to an analog signal, so that all the pulses for conversion to analog form can have an identical waveform as well as an identical area, and errors caused by the difference between the rise and fall times of the pulses can be eliminated and therefore D/A conversion characteristics can be improved.

What is claimed is:

1. A digital to analog converting circuit for converting serial digital data into analog signal output, comprising:

distributing means receptive of serial bit data pulses supplied sequentially for distributing the data pulses to at least two parallel channels, each distributed pulse of each channel having a constant width and a constant time interval between a termination of one pulse and a beginning of the next pulse in each channel;

converting means disposed in each channel for converting each pulse having said constant width into an analog value; and adding means for adding the analog values of said each channel and producing an analog signal output corresponding thereto.

2. A digital to analog converter comprising:

first means receptive of serial data pulses at constant time intervals for distributing the pulses to at least two parallel channels;

second means disposed in each channel for converting the distributed pulses to pulses of constant width;

third means for adding the pulses of constant width together in an analog form;

wherein for two channels the first means comprises a first AND gate receptive of the serial data pulses and a clock signal synchronized thereto and having an output, and a first flip-flop receptive of the output of the AND gate at a clock input and having Q and Q outputs, and two second AND gates receptive of the Q and Q outputs respectively for gating same with the original data pulses and having outputs; and wherein the second means comprises two second D-type flip-flops receptive of the outputs of the second AND gates at D inputs thereof and of the clock signal at the clock inputs thereof for generating the constant width pulses at outputs thereof.

3. A digital to analog converter comprising:

first means receptive of serial data pulses at constant time intervals for distributing the pulses to at least two parallel channels;

second means disposed in each channel for converting the distributed pulses to pulses of constant width;

third means for adding the pulses of constant width together in an analog form;

wherein for a plurality of channels the first means comprises a first AND gate receptive of the serial data pulses and a clock signal synchronized thereto and having an output and a ring counter receptive of the AND gate output at a clock input thereof and having a plurality of outputs;

wherein the second means comprises a plurality of D-type flip-flops each having a clock input connected to an output of the ring counter, a reset input and an output, a plurality of shift registers each having a shift input connected to an output of the D-type flip-flops, a clock input receptive of the clock signal and an output, and a plurality of second AND gates each having an input connected to the output of one D-type flip-flop and the output of one shift register associated with the one D-type flip-flop and having an output connected to the reset input of the one D-type flip-flop; and wherein the third means comprises a latch circuit having a plurality of inputs receptive of the outputs of the D-type flip-flops and having a plurality of outputs, and means for adding the plurality of outputs in analog form.

4. The digital to analog converter according to claim 3, wherein the plurality of channels comprises four channels.

* * * * *